US010504896B2

(12) United States Patent
Huang et al.

(10) Patent No.: US 10,504,896 B2
(45) Date of Patent: Dec. 10, 2019

(54) HVMOS RELIABILITY EVALUATION USING BULK RESISTANCES AS INDICES

(71) Applicant: Taiwan Semiconductor Manufacturing Company, Ltd., Hsinchu (TW)

(72) Inventors: Chi-Feng Huang, Zhubei (TW); Chia-Chung Chen, Keelung (TW); Tse-Hua Lu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 2 days.

(21) Appl. No.: 15/995,778

(22) Filed: Jun. 1, 2018

(65) Prior Publication Data

US 2018/0277539 A1 Sep. 27, 2018

Related U.S. Application Data

(62) Division of application No. 14/959,393, filed on Dec. 4, 2015, now Pat. No. 9,991,260, which is a division of application No. 13/111,730, filed on May 19, 2011, now Pat. No. 9,209,098.

(51) Int. Cl.
| | |
|---|---|
| *H01L 29/06* | (2006.01) |
| *H01L 27/092* | (2006.01) |
| *H01L 21/66* | (2006.01) |
| *H01L 27/02* | (2006.01) |
| *G01R 27/08* | (2006.01) |
| *G01R 31/02* | (2006.01) |
| *H01L 29/78* | (2006.01) |
| *H01L 29/10* | (2006.01) |

(52) U.S. Cl.
CPC ............ *H01L 27/092* (2013.01); *H01L 22/14* (2013.01); *H01L 22/34* (2013.01); *H01L 27/0207* (2013.01); *H01L 29/0619* (2013.01); *H01L 29/0649* (2013.01); *G01R 27/08* (2013.01); *G01R 31/02* (2013.01); *H01L 29/1087* (2013.01); *H01L 29/7835* (2013.01)

(58) Field of Classification Search
None
See application file for complete search history.

(56) References Cited

U.S. PATENT DOCUMENTS

| | | | |
|---|---|---|---|
| 3,487,301 | A | 12/1969 | Gardner et al. |
| 4,199,776 | A | 4/1980 | Ahmed |
| 4,264,941 | A | 4/1981 | London |
| 5,432,370 | A | 7/1995 | Kitamura et al. |
| 5,548,147 | A | 8/1996 | Mei |
| 5,633,202 | A | 5/1997 | Brigham et al. |
| 5,714,784 | A | 2/1998 | Ker et al. |

(Continued)

OTHER PUBLICATIONS

Appels, J.A., et al., "High-Voltage Thin Layer Devices (RESURF Devices)", IEDM Tech. Dig., Dec. 3-5, 1979 IEEE, 7 pgs.

(Continued)

*Primary Examiner* — Sue A Purvis
*Assistant Examiner* — Jordan M Klein
(74) *Attorney, Agent, or Firm* — Slater Matsil, LLP

(57) ABSTRACT

A method of determining the reliability of a high-voltage PMOS (HVPMOS) device includes determining a bulk resistance of the HVPMOS device, and evaluating the reliability of the HVPMOS device based on the bulk resistance.

20 Claims, 8 Drawing Sheets

(56) References Cited

U.S. PATENT DOCUMENTS

| | | |
|---|---|---|
| 5,998,846 A | 12/1999 | Jan et al. |
| 6,046,494 A | 4/2000 | Brigham et al. |
| 6,072,215 A | 6/2000 | Kawaji et al. |
| 6,469,354 B1* | 10/2002 | Hirata .............. H01L 27/0266 257/358 |
| 6,534,867 B1 | 3/2003 | Kamiya et al. |
| 6,563,908 B1 | 5/2003 | Enck, Jr. |
| 6,617,632 B2 | 9/2003 | Taniguchi et al. |
| 6,686,233 B2 | 2/2004 | Soderbarg et al. |
| 6,740,939 B2 | 5/2004 | Sayama et al. |
| 6,764,909 B2 | 7/2004 | Salling et al. |
| 6,833,568 B2* | 12/2004 | Duvvury .............. H01L 27/0207 257/173 |
| 6,858,901 B2 | 2/2005 | Ker et al. |
| 6,879,007 B2 | 4/2005 | Takamura |
| 6,902,258 B2 | 6/2005 | Chen et al. |
| 6,909,149 B2 | 6/2005 | Russ et al. |
| 6,924,693 B1 | 8/2005 | Black |
| 7,067,881 B2 | 6/2006 | Matsumoto et al. |
| 7,076,226 B2 | 7/2006 | Bult et al. |
| 7,112,848 B2 | 9/2006 | Lee |
| 7,214,992 B1 | 5/2007 | Strachan et al. |
| 7,220,637 B2 | 5/2007 | Ota et al. |
| 7,391,200 B1 | 6/2008 | Khanna et al. |
| 7,465,972 B2 | 12/2008 | Wang et al. |
| 7,480,879 B2 | 1/2009 | Checka et al. |
| 7,525,155 B2 | 4/2009 | Chen et al. |
| 7,531,402 B2 | 5/2009 | Ota et al. |
| 7,563,663 B2 | 7/2009 | Ota et al. |
| 7,588,946 B2 | 9/2009 | Tso et al. |
| 7,588,978 B2 | 9/2009 | Kim |
| 7,612,364 B2 | 11/2009 | Chuang et al. |
| 7,655,526 B2 | 2/2010 | Ko |
| 7,687,363 B2 | 3/2010 | Ko |
| 7,843,251 B2 | 11/2010 | Ji |
| 8,492,873 B1* | 7/2013 | Tan .............. H01L 21/761 257/490 |
| 2002/0055220 A1 | 5/2002 | Soderbarg et al. |
| 2002/0074569 A1 | 6/2002 | Taniguchi et al. |
| 2002/0096716 A1 | 7/2002 | Salling et al. |
| 2002/0130332 A1 | 9/2002 | Cho et al. |
| 2002/0158299 A1 | 10/2002 | Castro Simas et al. |
| 2002/0164858 A1 | 11/2002 | Sayama et al. |
| 2003/0059983 A1 | 3/2003 | Ota et al. |
| 2003/0098509 A1 | 5/2003 | Kamiya et al. |
| 2003/0207543 A1 | 11/2003 | Salling et al. |
| 2004/0026750 A1 | 2/2004 | Takamura |
| 2004/0227185 A1 | 11/2004 | Matsumoto et al. |
| 2005/0041070 A1 | 2/2005 | Chen et al. |
| 2005/0164439 A1 | 7/2005 | Takamura |
| 2005/0275021 A1 | 12/2005 | Matsumoto et al. |
| 2005/0275032 A1* | 12/2005 | Kodama .............. H01L 23/585 257/355 |
| 2006/0202285 A1 | 9/2006 | Kamiya et al. |
| 2006/0223269 A1* | 10/2006 | Honma .............. H01L 21/823814 438/294 |
| 2006/0255369 A1 | 11/2006 | Kim et al. |
| 2006/0273387 A1 | 12/2006 | Hisanaga |
| 2007/0007545 A1* | 1/2007 | Salcedo .............. H01L 27/0262 257/127 |
| 2007/0067747 A1 | 3/2007 | Checka et al. |
| 2007/0115606 A1 | 5/2007 | DeVries et al. |
| 2007/0132008 A1 | 6/2007 | Kang et al. |
| 2007/0148844 A1 | 6/2007 | Ko |
| 2007/0161249 A1 | 7/2007 | Ko |
| 2007/0202634 A1 | 8/2007 | Ota et al. |
| 2008/0001189 A1 | 1/2008 | Jong et al. |
| 2008/0017948 A1 | 1/2008 | Huang et al. |
| 2008/0042197 A1 | 2/2008 | Yamagishi et al. |
| 2008/0061358 A1 | 3/2008 | Choi |
| 2008/0064192 A1 | 3/2008 | Kim |
| 2008/0073721 A1* | 3/2008 | Fuchigami .............. H01L 23/585 257/355 |
| 2008/0073745 A1 | 3/2008 | Tang et al. |
| 2008/0157197 A1 | 7/2008 | Hsieh et al. |
| 2008/0207578 A1 | 8/2008 | Chu et al. |
| 2008/0309365 A1 | 12/2008 | Liao et al. |
| 2009/0008711 A1 | 1/2009 | Wei et al. |
| 2009/0010072 A1 | 1/2009 | Tanaka et al. |
| 2009/0130812 A1 | 5/2009 | Huang et al. |
| 2009/0140343 A1 | 6/2009 | Feilchenfeld et al. |
| 2009/0230457 A1* | 9/2009 | Lee .............. H01L 27/11519 257/324 |
| 2009/0261426 A1 | 10/2009 | Feilchenfeld et al. |
| 2010/0052057 A1 | 3/2010 | Chung et al. |
| 2010/0097125 A1 | 4/2010 | Ji |
| 2010/0219504 A1 | 9/2010 | Chen et al. |
| 2011/0057262 A1 | 3/2011 | Ma et al. |
| 2011/0080454 A1 | 4/2011 | Ghozeil et al. |
| 2011/0163375 A1 | 7/2011 | Chu et al. |
| 2011/0193131 A1 | 8/2011 | Blanchard et al. |
| 2011/0269283 A1 | 11/2011 | Tien et al. |
| 2012/0026027 A1 | 2/2012 | Steensgaard-Madsen |
| 2012/0049282 A1 | 3/2012 | Chen et al. |
| 2012/0126319 A1 | 5/2012 | Feilchenfeld et al. |
| 2012/0212279 A1 | 8/2012 | Chen et al. |
| 2013/0161723 A1 | 6/2013 | Yao et al. |
| 2013/0313548 A1 | 11/2013 | Yano et al. |
| 2014/0113418 A1 | 4/2014 | Ota et al. |
| 2014/0159172 A1 | 6/2014 | Hu |
| 2014/0203242 A1 | 7/2014 | Kozaki |

OTHER PUBLICATIONS

Blackburn, D.L., "Turn-Off Failure of Power MOSFETs," IEEE Transactions on Power Electronics, vol. PE-2, No. 2, Apr. 1987, pp. 136-142.

Hower, P.L., et al., "Avalanche Injection and Second Breakdown in Transistors," IEEE Transactions on Electron Devices, vol. ED-17, No. 4, Apr. 1970, pp. 320-335.

Kwamoto, K., et al., "A No-Snapback LDMOSFET with Automotive ESD Endurance", IEEE Transactions on Electron Devices, vol. 49, No. 11, Nov. 2002, pp. 2047-2053.

Nezar, A., "Breakdown Voltage in LDMOS Transistors Using Internal Field Rings," IEEE Transactions on Electron Devices, vol. 38, No. 7, Jul. 1991, pp. 1676-1680.

Zheng, G., "The Robustness Study of Power Semiconductor Devices," Aug. 1, 1992, 6 pgs. (No English translation available.).

* cited by examiner

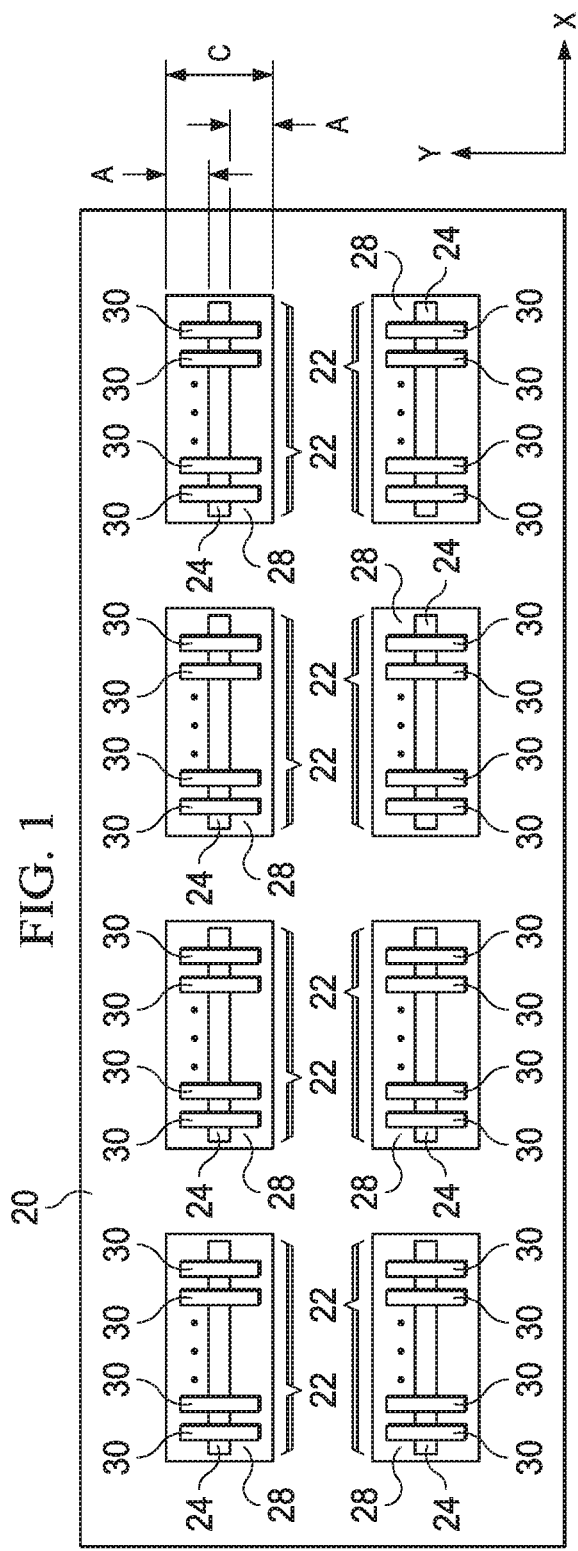

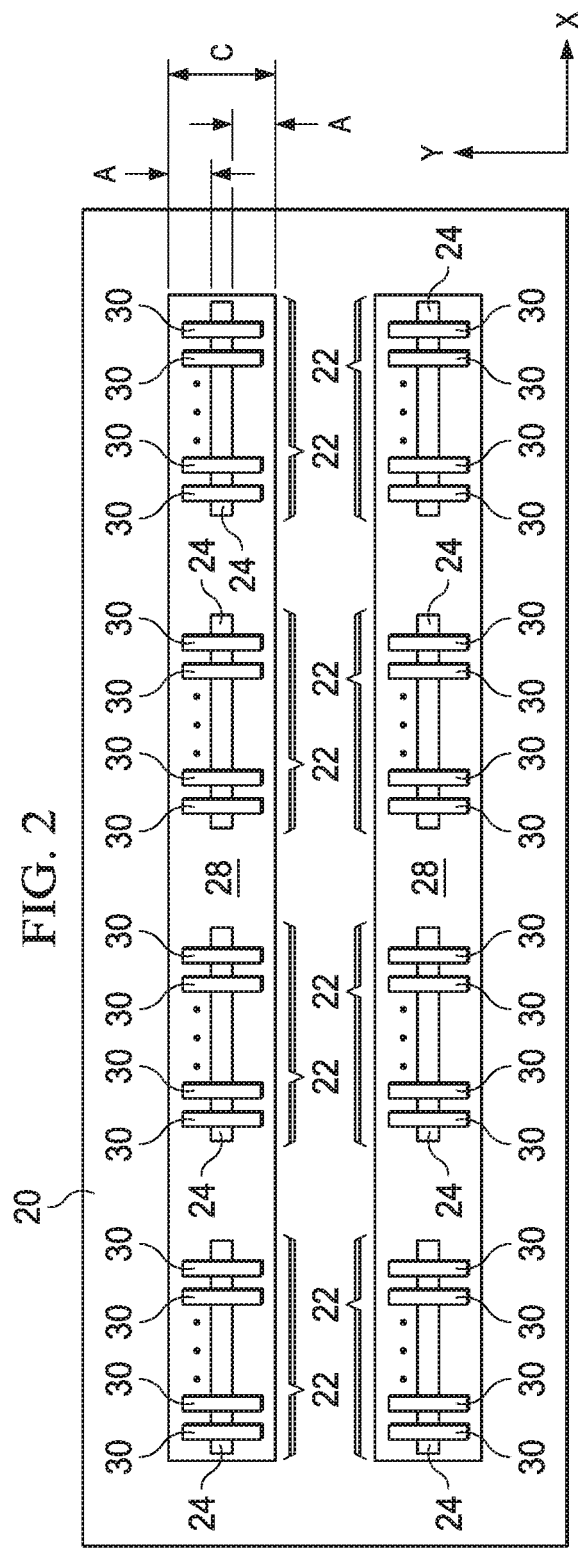

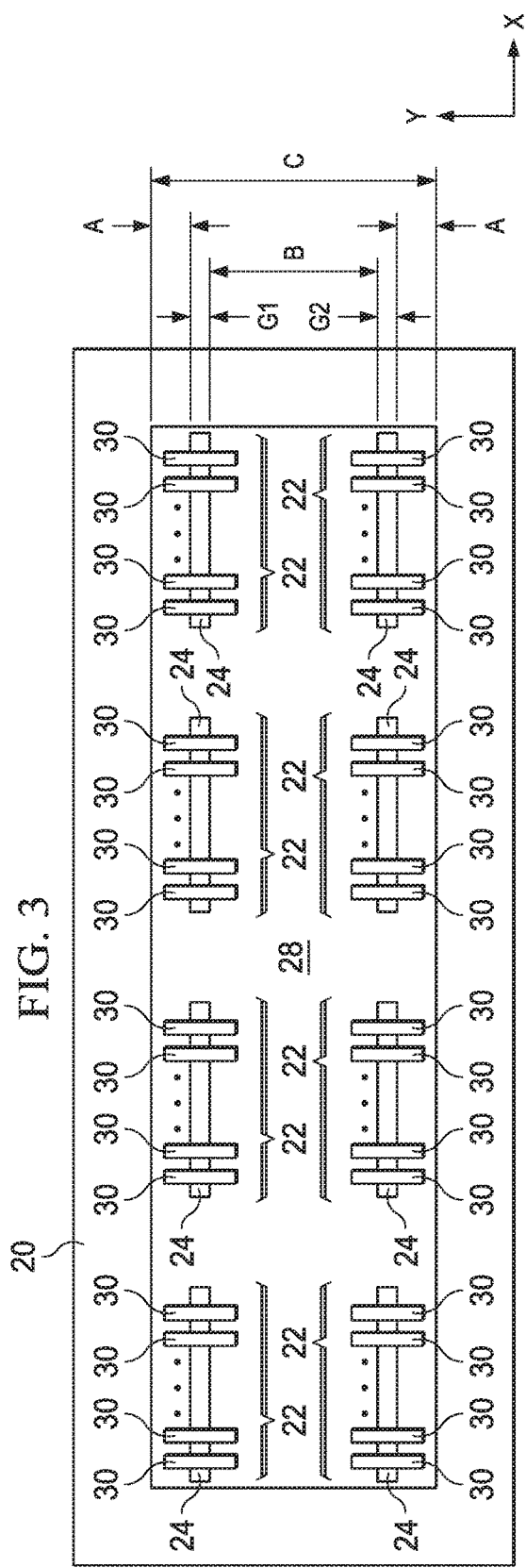

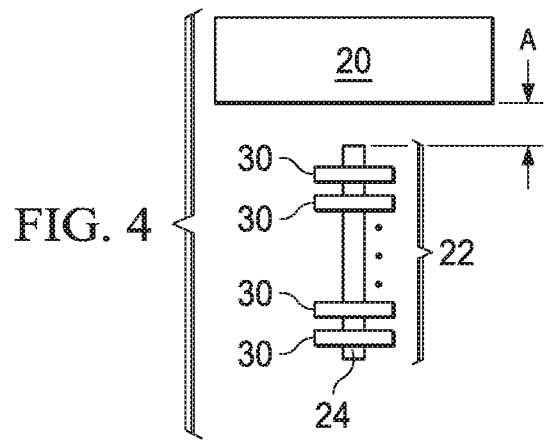
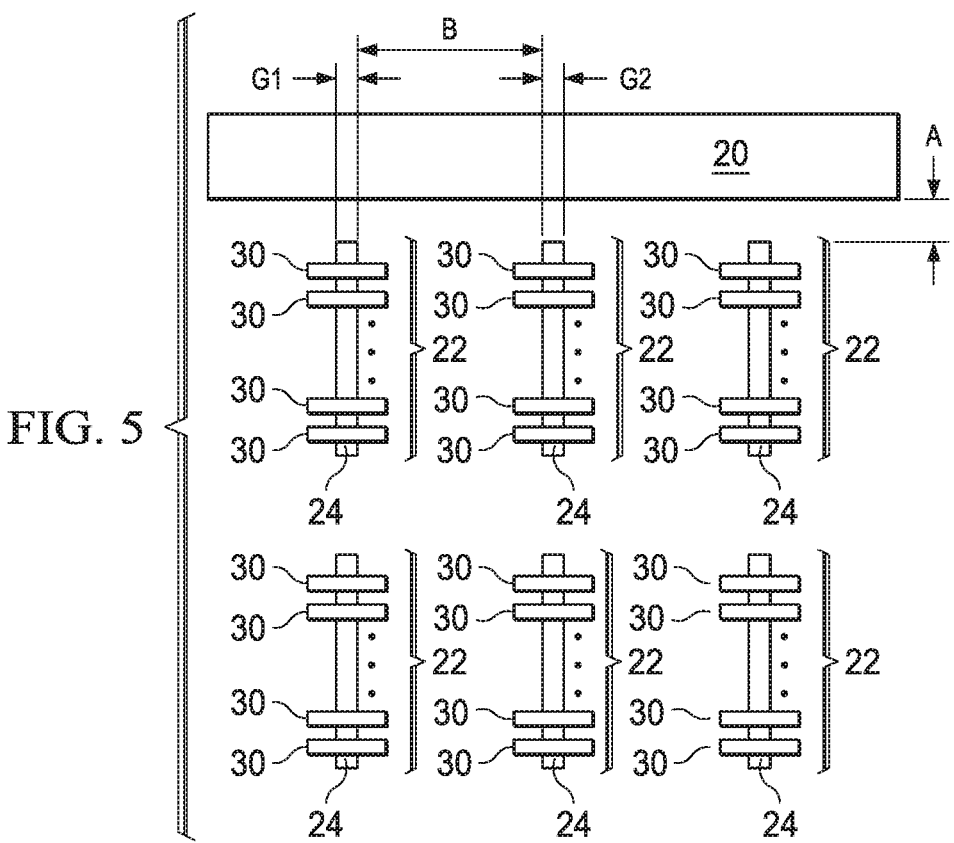

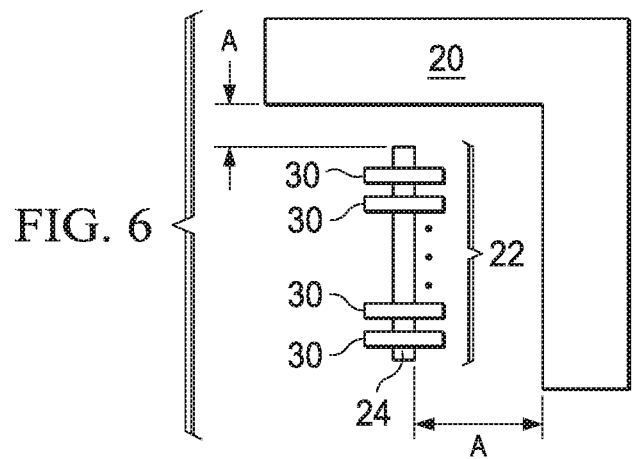
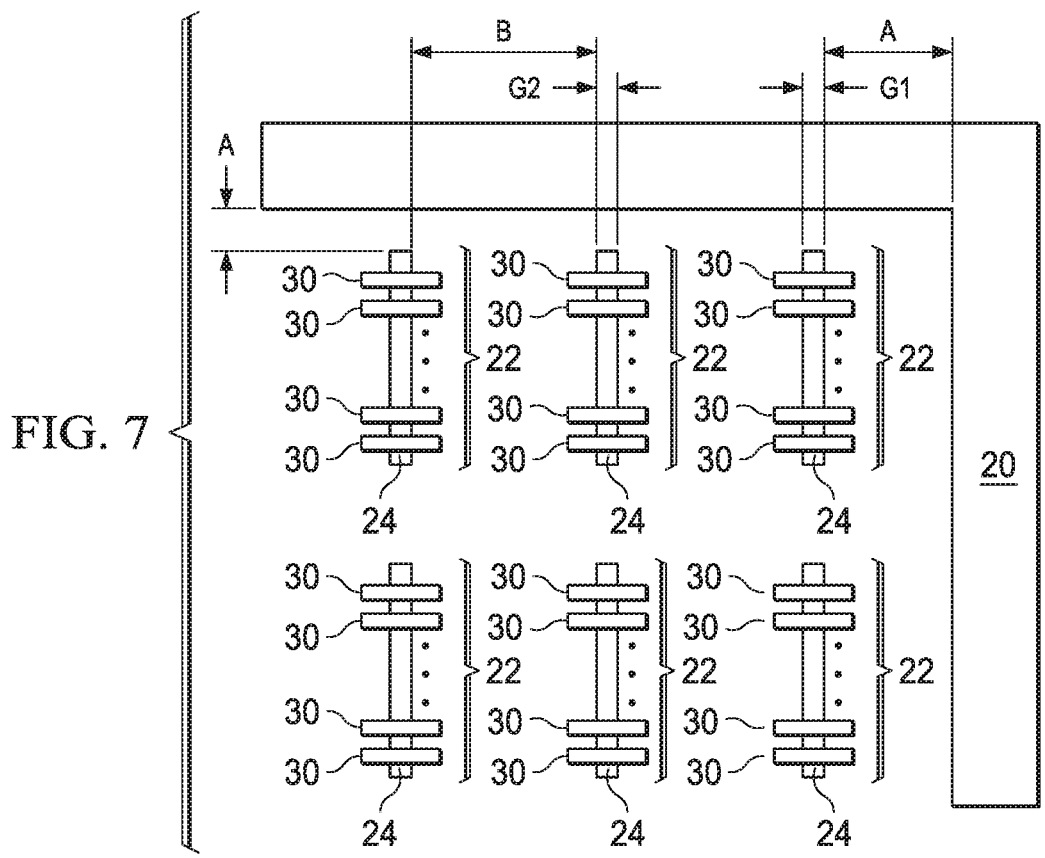

HVMOS RELIABILITY EVALUATION USING BULK RESISTANCES AS INDICES

PRIORITY CLAIM AND CROSS-REFERENCE

This application is a divisional of U.S. patent application Ser. No. 14/959,393, entitled "HVMOS Reliability Evaluation using Bulk Resistances as Indices," filed on Dec. 4, 2015, which is a divisional of U.S. patent application Ser. No. 13/111,730, entitled "HVMOS Reliability Evaluation using Bulk Resistances as Indices," filed on May 19, 2011, now U.S. Pat. No. 9,209,098 issued Dec. 8, 2015, which applications are incorporated herein by reference.

BACKGROUND

In some of the existing reliability tests of high-voltage metal-oxide-semiconductor (HVMOS) devices, a plurality of sample HVMOS devices is formed on a wafer. The sample HVMOS devices may have different structures, for example, with different sizes and dimensions. Time dependent dielectric breakdown (TDDB) tests are performed on the sample devices. Typically, the TDDB tests are performed by stressing the HVMOS devices with currents, and the tests may be performed at elevated temperatures. The tests may be performed until the sample devices fail. Accordingly, the tests are time-consuming. The TDDB test results are then analyzed to determine the reliability of the HVMOS devices.

Due to the long time needed to perform the TDDB tests, the tests are difficult to catch up with the product design cycle time. Furthermore, the existing TDDB tests do not support the establishments of design rules, and designers cannot use the results of the TDDB tests to guide the design process.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 8 illustrate top views of high-voltage p-type metal-oxide-semiconductor (HVPMOS) test structures in accordance with embodiments;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A design rule for guiding the design of high-voltage p-type metal-oxide-semiconductor (HVPMOS) devices is provided in accordance with an embodiment. A method for quickly evaluating reliability of the HVPMOS devices is provided, wherein the reliability is related to the time dependent dielectric breakdown (TDDB) characteristics of the HVPMOS devices. Throughout the various views and illustrative embodiments, like reference numbers are used to designate like elements.

FIGS. 1 through 8 are top views of test structures in accordance with various embodiments. In each of FIGS. 1 through 8, guard ring 20 is formed adjacent HVPMOS devices 22. In FIG. 1, each of active regions 24 of HVPMOS devices 22 is encircled by, and separate from each other, by guard ring 20. In FIG. 2, a row of HVPMOS devices 22 is encircled by guard ring 20, and different rows of HVPMOS devices 22 are separated from each other by guard ring 20. Active regions 24 in a same row, however, are not separated from each other by guard ring 20. In FIG. 3, a plurality of rows (such as two rows) of HVPMOS devices 22 is encircled by the same guard ring 20, and different rows of active regions 24 are not separated from each other by guard ring 20. Instead, two or more rows of active regions 24 are separated from each other by isolation regions 28, which may be shallow trench isolation (STI) regions.

Figure 8:
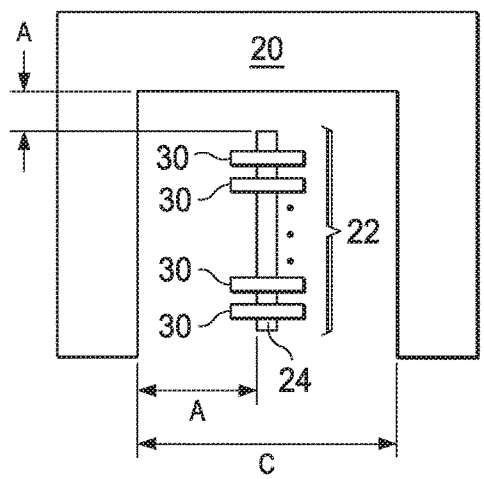

FIGS. 4 through 7 illustrate guard rings 20 that are adjacent to, and extend to one side, two sides, or three sides of HVPMOS devices 22. The illustrated guard rings 20 may, or may not, form a ring encircling HVPMOS device(s) 22 in the respective top views. In FIG. 4, guard ring 20 extends along a side of HVPMOS device 22. In FIG. 5, guard ring 20 extends along a side of a plurality of HVPMOS devices 22. In FIG. 6, guard ring 20 extends along two sides of HVPMOS device 22. In FIG. 7, guard ring 20 extends along two sides of a plurality of HVPMOS devices 22, wherein the two sides of guard ring 20 may be perpendicular to each other. In FIG. 8, guard ring 20 extends along three sides of HVPMOS device 22. In alternative embodiments (not shown), guard ring 20 may extend along three sides of a plurality of HVPMOS devices 22.

In FIGS. 1 through 8, one or a plurality of gate electrodes 30, which may be polysilicon lines, may be formed over each of active regions 24. Gate electrodes 30 and the respective underlying active regions 24 thus form HVPMOS devices 22, wherein the HVPMOS devices 22 formed of different gate electrodes 30, and share a same active region 24, may be connected in parallel to form a large HVPMOS device.

Figure 9:
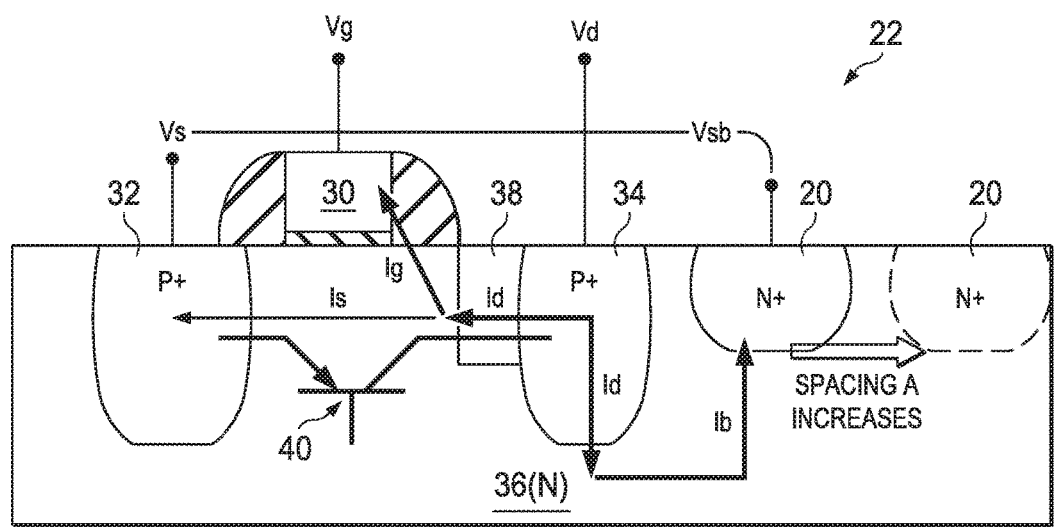
FIG. 9 illustrates a cross-sectional view of a HVPMOS device as shown in FIGS. 1 through 8.

FIG. 9 illustrates a cross-sectional view of a portion of one of HVPMOS devices 22 as shown in FIGS. 1 through 8. HVPMOS device 22 is formed over n-well region 36, which is further formed over a substrate (of p-type, for example, not shown). Source region 32 and drain region 34 may be formed of heavily doped p-type regions comprising p-type impurities. Guard ring 20 may be heavily or moderately doped n-type regions, which contact the underlying n-well region 36. In the described embodiments, "heavily doped" means an impurity concentration greater than about $10^{19}/cm^3$. Similarly, "moderately doped" may mean an impurity concentration between about $10^{17}/cm^3$ and about $10^{19}/cm^3$. One skilled in the art will recognize, however, that the terms "heavily doped" and "moderately doped" are terms of art that depend upon the specific device type, technology generation, minimum feature size, and the like. It is intended, therefore, that these terms be interpreted in light of the technology being evaluated and not be limited to the described embodiments. Further, lightly doped drain extension region 38, which has a significantly lower p-type impurity concentration than source/drain regions 32 and 34, may be formed to laterally space drain region 34 from gate electrode 30, so that the breakdown voltage of HVPMOS device 22 is increased to a desirable value. Alternatively, instead of forming drain extension region 38, an STI region (not shown, similar to STI region as in FIGS. 1 through 8) is formed where drain extension region 38 is located. It is noted that in FIG. 9, guard ring 20 is shown as in the same vertical plane as source region 32 and drain region 34 of HVPMOS device 22, while it may not be in the same vertical plane in reality. Parasitic lateral bipolar junction transistor (BJT) 40 is formed, with source region 32, n-well region 36, and drain region 34 acting as the emitter, base, and collector, respectively, of lateral BJT 40.

During the operation of HVPMOS device 22, drain voltage Vd may be a high voltage, for example, 5V or higher. Source region 32 and gate electrode 30 may be applied with a low voltage such as 0V or other low voltages. In an exemplary embodiment, HVPMOS device 22 is a 5V HVPMOS device designed to be operated under drain voltage up to 5 volts without being damaged. When gate voltage Vg and source voltage Vs are 0V, with the increase in drain voltage Vd to 5V and higher, several operation stages may occur, wherein FIG. 10 illustrates the respective currents in different operation stages.

Figure 10:
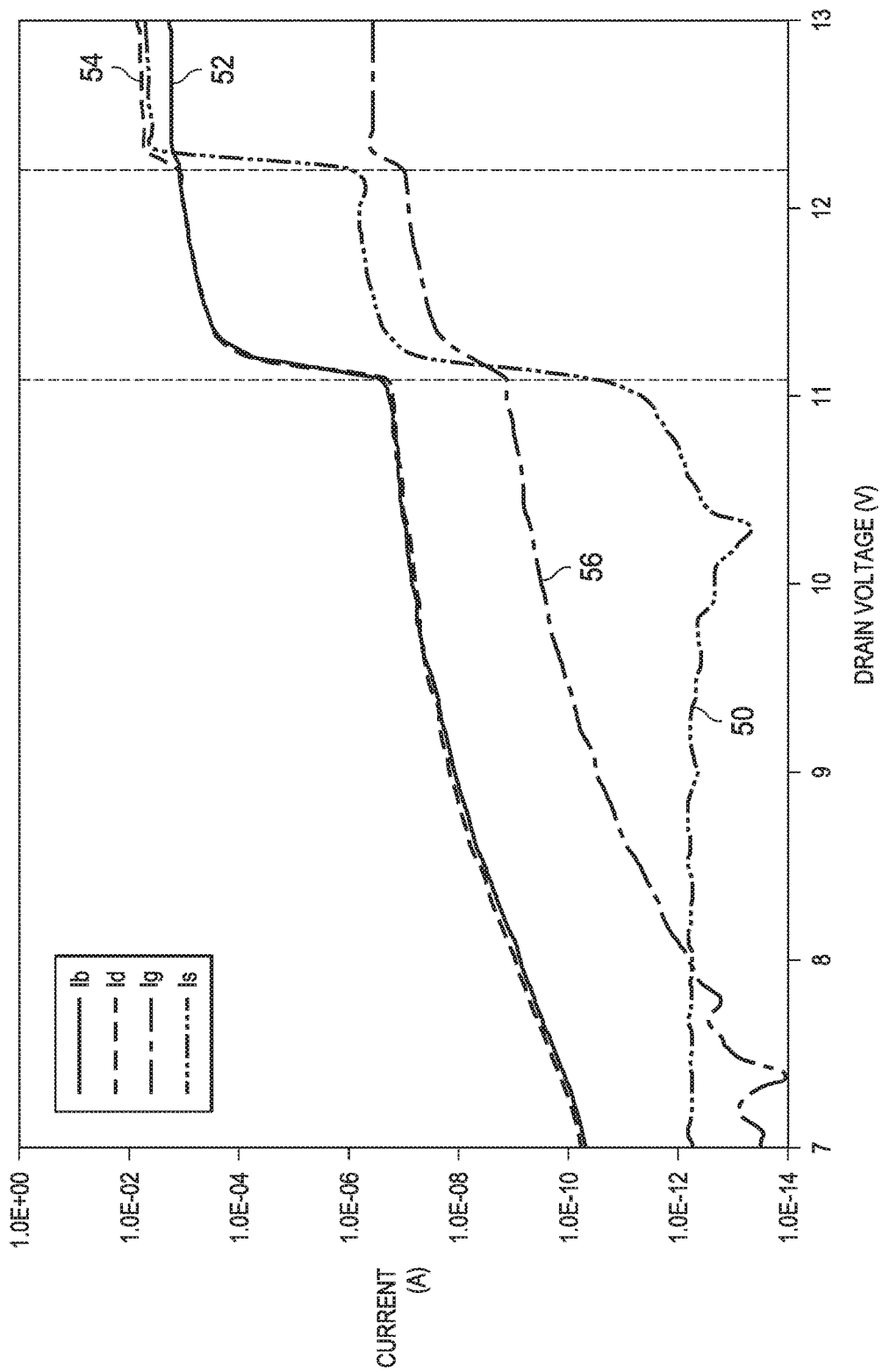
FIG. 10 illustrates the various currents in the HVPMOS device as a function of drain voltages.

Referring to FIG. 10, lines 50, 52, 54, and 56 are currents Is, Ib, Id, and Ig, respectively, which currents are obtained with drain voltage Vd increasing from 0V to 13V. Current Is is the source current received by source region 32 (FIG. 9). Current Ib is the bulk current flowing into guard ring 20. Current Id is the drain current of drain region 34. Current Ig is the gate current of gate electrode 30. As shown in FIG. 9, bulk current Ib forms a portion of drain current Id.

Referring again to FIG. 10, in a first stage of the operation of HVPMOS device 22, drain voltage Vd is smaller than about 11V. With the increase in drain voltage Vd, drain current Id increases gradually and not abruptly. During the first stage, bulk current Ib dominates drain current Id. Lateral BJT 40 (FIG. 9) is not turned on, and there is substantially no source current Is. During a second stage of the operation, which stage ranges from Vd equal to about 11.1 volts to about 12.2 volts, lateral BJT 40 is turned on, and a soft breakdown occurs to HVPMOS device 22. During the second stage, source current Is (line 50) increases significantly, and becomes a significant portion of drain current Id. During a third stage of the operation, in which drain voltage Vd is greater than about 12.2V, source current Is (line) 50 increases significantly to substantially equal to bulk current Ib (line 52). As shown in FIG. 10, source current Is may also be greater than bulk current Ib. Since the current gain β of lateral BJT 40 is equal to Is/Ib, current gain β may be greater than 1. Accordingly, a positive feedback is established for the operation of LBJT 40 (FIG. 9), and gate current Ig (line 56) significantly increases. Therefore, the breakdown of the gate oxide of HVPMOS device 22 may eventually cause the damage of HVPMOS device 22.

Experiments results were performed on a plurality of test structures shown in FIGS. 1 through 8. The plurality of test structures have different combinations of spacings/distances A, B, C, G1, and G2, as shown in FIGS. 1 through 8. Active-region-to-guard-ring spacing A is the distance from an outer edge (the edge facing guard ring 20) of active region 24 to the nearest guard ring 20. Inner-GR-to-GR-spacing C (FIG. 2) is the distance between opposite inner sidewalls (of guard ring 20) that face each other. Active-region-spacing B (FIG. 3) is the spacing of two neighboring active regions 24 in two neighboring rows, wherein the two neighboring rows of active regions 24 are not separated from each other by guard ring 20. In the two-row test structures as shown in FIG. 3, the widths of active regions 24 are denoted as G1 and G2. Active-region-to-guard-ring spacing A, active-region-spacing B, inner-GR-to-GR-spacing C, and widths G1 and G2 are measured in the channel width direction of the respective HVPMOS device 22, which are the Y directions in FIGS. 1 through 8.

The experiment results revealed that, contrary to the conventional understanding that spacing A does not affect the respective adjacent HVPMOS devices, active-region-to-guard-ring spacing A has a significant effect on the reliability of the respective adjacent HVPMOS devices. With the increase in active-region-to-guard-ring spacing A (as shown by an arrow in FIG. 9), current gain β of lateral BJT 40 (FIG. 9) increases. In some of the sample devices, current gain β may saturate at about 3 when active-region-to-guard-ring spacing A is increased to about 80 μm. In some embodiments, substantially all sample devices with active-region-to-guard-ring spacing A greater than about 50 μm fail in the TDDB tests. When current gain β is greater than 1, the respective HVPMOS 22 is found to be not reliable, and is very likely to be damaged. Experiment results also revealed that when active-region-to-guard-ring spacing A is smaller than about 2 μm, current gain β is reduced to lower than 1, while when active-region-to-guard-ring spacing A is 5 μm, the current gain β is already greater than 1. This means that when spacing A is smaller than about 2 μm, the respective HVPMOS device 22 is reliable. Accordingly, in the embodiments, a design rule may be set so that all HVPMOS devices in a same chip and having guard rings nearby are designed to have the respective active-region-to-guard-ring spacings A smaller than about 2 μm.

Through experiments, it is also found that the reliability of HVPMOS devices 22 is also related to spacings B, C, G1, and G2 (FIGS. 1 through 8), and HVPMOS devices 22 are reliable when spacing B is smaller than about 6 μm, spacing C is smaller than about 30 μm, and spacings G1 and G2 are smaller than about 10 μm. HVPMOS devices 22 are more reliable if spacings A, B, C, G1, and G2 are all less than about 2 μm, 6 μm, 30 μm, 10 μm, and 10 μm, respectively. These spacing requirements regarding spacings A, B, C, G1, and G2 may be set as design rules to guide the design of HVPMOS devices.

Figure 12:
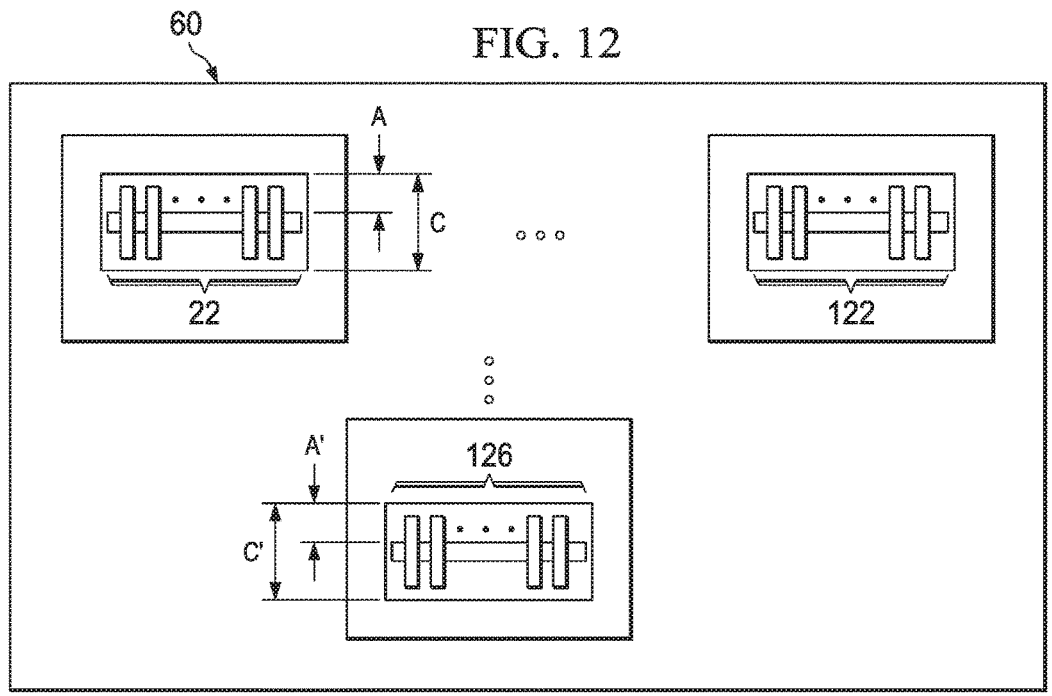
FIG. 12 illustrates a schematic top view of a chip comprising a plurality of HVPMOS devices and a HVNMOS device.

FIG. 12 illustrates a schematic view of chip 60, which includes first HVPMOS device 22, second HVPMOS device 122, and HVNMOS device 126. It is found that the reliability of HVNMOS device 126 is not affected by spacings A' and C', which are defined essentially the same as the respective spaces A and C as shown in FIGS. 1 through 8. Accordingly, spacings A' and C' of HVNMOS device 126 may be greater than about 2 μm and 30 μm, respectively, without the reliability problem. Spacing A' may also be greater than about 50 μm or about 80 μm without the reliability problem. Each of HVPMOS devices 22 and 122 may be a digital device, an analog device, a radio-frequency (RF) device, or the like. Regardless of the types, HVPMOS devices 22 and 124 need to have spacings following the design rules set according to the embodiments. HVPMOS devices 22 and 122 may also be the test devices as shown in FIGS. 1 through 8. In some embodiments, in order to be able to evaluate the characteristics of HVPMOS devices without causing them to pre-maturely fail, the spacings A, B, C, G1, and G2 of all, or some but not all, test structures in the same chip also need to follow the above-described design rules.

Referring back to FIG. 9 again, source region 32 and guard ring 20 has a voltage difference referred to as source-to-bulk voltage Vsb. The value Vsb/Ib (with Ib being bulk current Ib as shown in FIG. 9) defines a resistance value referred to as bulk resistance Rb. Assuming bulk resistance Rb is the value of Vsb/Ib when source-to-bulk voltage Vsb is equal to about 0.7V (or in the range between about 0.7V and about 0.8V), bulk resistance Rb and active-region-to-guard-ring spacing A has the relationship shown in FIG. 11. Alternatively, if bulk resistance Rb is defined as proportional to, but not equal to, Vsb/Ib, the relationship also holds true.

Figure 11:
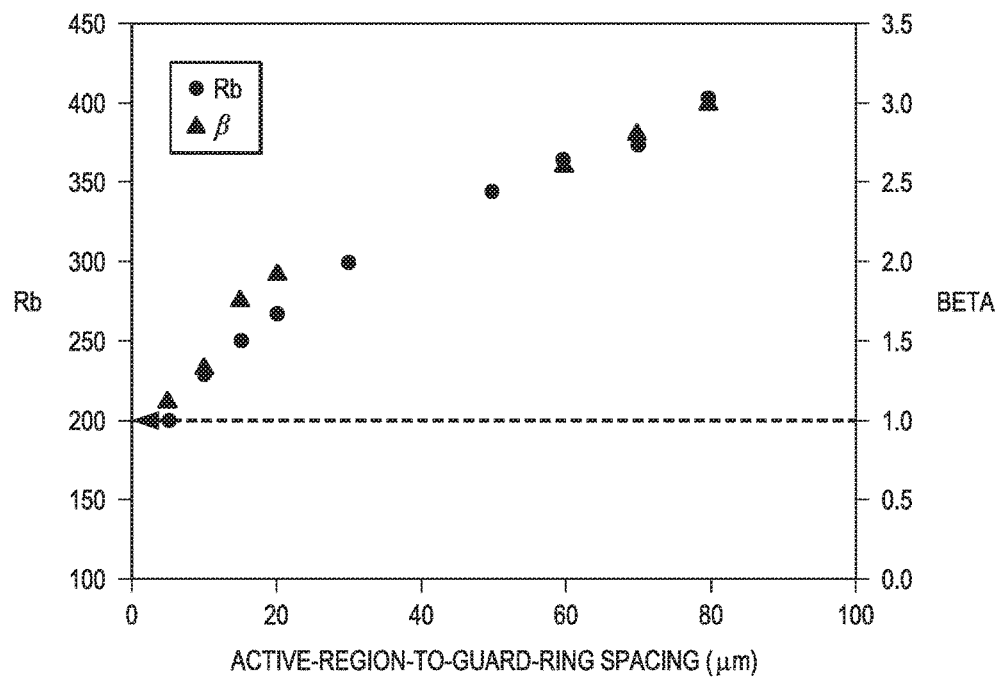
FIG. 11 illustrates bulk resistances Rb and current gains β as functions of active-region-to-guard-ring spacings.

In FIG. 11, the left Y axis is the bulk resistance Rb, and corresponds to the points shown as diamonds. The right Y axis is the current gain β, and corresponds to the points shown as squares. The X axis is the active-region-to-guard-ring spacing A. As shown in FIG. 11, bulk resistance Rb and current gain β have the same trend, wherein both increase in values with the increase of active-region-to-guard-ring spacing A. FIG. 11 shows that there is a strong correlation between bulk resistance Rb and current gain β.

Since current gain β is directly related to the reliability of the respective HVPMOS devices, bulk resistance Rb may also be used as an indicator of the reliability of the respective HVPMOS devices. Accordingly, in accordance with embodiments, the evaluation of the reliability of HVPMOS devices includes forming the HVPMOS devices on silicon substrates, and measuring and calculating the bulk resistances Rb of the HVPMOS devices to determine the reliability of the respective HVPMOS devices. It is realized that the bulk resistance Rb may be affected by various factors such as the doping concentration of n-well region 36 in FIG. 9. Accordingly, a reference bulk resistance Rbref may be found from reference sample HVPMOS devices, which reference bulk resistance Rbref corresponds to current gain β of 1. The HVPMOS device with the current gain β equal to 1 is referred to as a reference HVPMOS device hereinafter.

In an example of determining reference bulk resistance Rbref, a plurality of HVPMOS devices having different spacings A may be formed on a wafer, and the current gains β of these HVPMOS devices may be measured. The spacings A of the HVPMOS devices may range from smaller than 1 µm to about 50 µm, for example, to ensure that among these HVPMOS devices, there is one reference HVPMOS device having current gain β substantially equal to 1. By measuring source currents Is and bulk currents Ib, current gains β of the HVPMOS devices may be found, and the reference HVPMOS device may be chosen. The bulk resistance of the reference HVPMOS device is measured and calculated to find reference bulk resistance Rbref.

In the embodiments, the HVPMOS devices with the bulk resistance Rb values greater than reference bulk resistance Rbref (with a reasonable margin) are determined as not reliable, while the HVPMOS devices with the bulk resistance Rb values smaller than reference bulk resistance Rbref (with a reasonable margin) may be determined as reliable. Alternatively, instead of forming the HVPMOS devices and measuring and calculating the bulk resistances Rb, simulations may be performed to find out the bulk resistances Rb of HVPMOS devices, and the reliability of the HVPMOS devices may be evaluated based on the simulated bulk resistance Rb, for example, by comparing them with reference bulk resistance Rbref, which may be simulated or measured from HVPMOS devices in physical silicon chips. Using bulk resistances Rb to evaluate the reliability of HVPMOS devices takes much less cycle time than the conventional methods of TDDB performance evaluation.

Furthermore, the evaluation of the reliability of HVPMOS devices comprises measuring spacings A, B, C, G1, and G2 (FIGS. 1 through 8) of the HVPMOS devices, wherein if any of the HVPMOS devices have the respective spacings greater than what is specified by the design rules in accordance with the embodiment shown in FIGS. 1 through 8, it may be determined that the respective HVPMOS devices are not reliable.

By using the embodiments, the adverse effects of guard ring to the reliability of HVPMOS devices are substantially eliminated. Furthermore, the bulk resistance values may be used as criteria to evaluate the reliability of HVPMOS devices, hence the reliability evaluation may be performed much faster than using conventional methods.

In accordance with embodiments, a method of determining the reliability of a HVPMOS device includes determining a bulk resistance of the HVPMOS device, and evaluating the reliability of the HVPMOS device based on the bulk resistance.

In accordance with other embodiments, a method includes determining a reference bulk resistance of a reference HVPMOS device, wherein a parasitic lateral BJT of the reference HVPMOS device has a current gain equal to about 1. The lateral BJT has a source, a drain, and a well region of the reference HVPMOS device as an emitter, a collector, and a base, respectively. Bulk resistances of a plurality of HVPMOS devices on a chip are determined. The reliability of the plurality of HVPMOS devices are determined by comparing the bulk resistances with the reference bulk resistance.

In accordance with yet other embodiments, a device includes a semiconductor chip, wherein all HVPMOS devices in the semiconductor chip and including adjacent guard rings have active-region-to-guard-ring spacings smaller than about 2 µm. The active-region-to-guard-ring spacings are distances between outer edges of active regions of the respective HVPMOS devices and corresponding nearest n-type guard rings. The active-region-to-guard-ring spacings are measured in channel width directions of the respective HVPMOS devices.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:
1. A structure comprising:
a semiconductor substrate;
a plurality of High-Voltage P-type Metal-Oxide-Semiconductor (HVPMOS) devices formed at a surface of the semiconductor substrate, wherein the plurality of HVPMOS devices form an array comprising a plurality of rows and a plurality of columns; and
an n-type guard ring comprising a plurality of portions, each encircling one of the plurality of HVPMOS devices, with neighboring ones of the plurality of HVPMOS devices separated from each other by the n-type guard ring.

2. The structure of claim 1 further comprising a plurality of isolation regions separated from each other by the n-type guard ring, and each of the plurality of HVPMOS devices comprises an active region encircled by one of the plurality of isolation regions.

3. The structure of claim 2, wherein the plurality of isolation regions comprise an isolation region encircled by one of the plurality of portions, with no High-Voltage N-type Metal-Oxide-Semiconductor (HVNMOS) having any active region that is also encircled by the isolation region.

4. The structure of claim 3, wherein each of the plurality of portions encircles an active region of a single HVPMOS device, and no active region of any additional MOS device is encircled by any of the plurality of isolation regions.

5. The structure of claim 2, wherein the active region of the each of the plurality of HVPMOS devices has an active-region-to-guard-ring spacing smaller than about 2 μm, and the active-region-to-guard-ring spacing is between the active region and a nearest portion of the n-type guard ring.

6. The structure of claim 1, wherein a region encircled by the n-type guard ring has a length and a width smaller than the length, with the width being smaller than about 30 μm.

7. The structure of claim 6, wherein the width is measured in a direction perpendicular to lengthwise directions of active regions of the plurality of HVPMOS devices.

8. The structure of claim 1 further comprising a High-Voltage N-type Metal-Oxide-Semiconductor (HVNMOS) device encircled by an additional guard ring, wherein the HVNMOS device has an additional active-region-to-guard-ring spacing greater than 2 μm.

9. The structure of claim 8, wherein the HVNMOS device comprises an active region encircled by an additional isolation region, and no addition MOS device has any active region encircled by the additional isolation region.

10. The structure of claim 1, wherein the n-type guard-ring comprises a portion of the semiconductor substrate that are heavily doped as n-type.

11. A structure comprising:
a semiconductor substrate;
a heavily doped semiconductor region extending into the semiconductor substrate wherein the heavily doped semiconductor region forms a guard ring;
a plurality of isolation regions extending into the semiconductor substrate and forming an array, wherein each of the plurality of isolation regions is separated from other ones of the plurality of isolation regions by the heavily doped semiconductor region;
a plurality of active regions, each encircled by one of the plurality of isolation regions, wherein the plurality of active regions have active-region-to-guard-ring spacings smaller than about 2 pm; and
a plurality of High-Voltage P-type Metal-Oxide-Semiconductor (HVPMOS) devices formed based on the plurality of active regions.

12. The structure of claim 11, wherein each of the plurality of isolation regions encircles a single active region.

13. The structure of claim 11, wherein the heavily doped semiconductor region forms a plurality of rings that are interconnected with each other, and inside each of the plurality of rings, a single one of the plurality of HVPMOS devices is formed.

14. The structure of claim 11, wherein each of the plurality of isolation regions has a length and a width smaller than the length, with the width being smaller than about 30 μm.

15. The structure of claim 11 further comprising a High-Voltage N-type Metal-Oxide-Semiconductor (HVNMOS) device encircled by an additional heavily doped semiconductor region, wherein the HVNMOS device has an additional active-region-to-guard-ring spacing greater than 2 μm.

16. The structure of claim 11, wherein the heavily doped semiconductor region has an n-type impurity concentration higher than about $1 \times 10^{19}/cm^3$.

17. A structure comprising:
a semiconductor substrate;
a heavily doped semiconductor region extending into the semiconductor substrate, wherein the heavily doped semiconductor region is of n-type;
a plurality of Shallow Trench Isolation (STI) regions extending into the semiconductor substrate and forming an array, wherein each of the plurality of STI regions is separated from other ones of the plurality of STI regions by the heavily doped semiconductor region;
a plurality of active regions, each encircled by one of the plurality of STI regions, wherein each of the plurality of STI regions has a rectangular top-view shape, and has a length and a width smaller than the length, with the width being smaller than about 30 μm; and
a plurality of High-Voltage P-type Metal-Oxide-Semiconductor (HVPMOS) devices, each being formed based on one of the plurality of active regions.

18. The structure of claim 17, wherein each of the plurality of STI regions encircles a single active region.

19. The structure of claim 17, wherein the heavily doped semiconductor region forms a plurality of rings that are interconnected with each other to form a continuous semiconductor region, and inside each of the plurality of rings, a single one of the plurality of HVPMOS devices is formed.

20. The structure of claim 17, wherein the heavily doped semiconductor region has an n-type impurity concentration higher than about $1 \times 10^{19}/cm^3$.

* * * * *

UNITED STATES PATENT AND TRADEMARK OFFICE
CERTIFICATE OF CORRECTION

PATENT NO. : 10,504,896 B2
APPLICATION NO. : 15/995778
DATED : December 10, 2019
INVENTOR(S) : Chi-Feng Huang Page 1 of 1

It is certified that error appears in the above-identified patent and that said Letters Patent is hereby corrected as shown below:

In the Claims

In Column 8, Line 2, Claim 11, delete "about 2 pm" and insert --about 2 μm--.

Signed and Sealed this
Fourteenth Day of April, 2020

Andrei Iancu
*Director of the United States Patent and Trademark Office*